(12) United States Patent
Harris et al.

(10) Patent No.: US 7,570,081 B1
(45) Date of Patent: Aug. 4, 2009

(54) MULTIPLE-OUTPUT STATIC LOGIC

(75) Inventors: David Money Harris, Upland, CA (US); Chih-Kong Yang, Pacific Palisades, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 68 days.

(21) Appl. No.: 11/513,605

(22) Filed: Aug. 30, 2006

(51) Int. Cl.
*H03K 19/20* (2006.01)
*H03K 19/094* (2006.01)

(52) U.S. Cl. .................................. 326/121; 326/119
(58) Field of Classification Search .............. 326/104, 326/105, 112, 119, 121
See application file for complete search history.

(56) References Cited

U.S. PATENT DOCUMENTS

| | | | | |
|---|---|---|---|---|
| 4,851,714 | A * | 7/1989 | Hwang | ........................ 326/98 |
| 5,719,803 | A | 2/1998 | Naffziger | |
| 2002/0063583 | A1 * | 5/2002 | Eaton | ........................ 326/121 |
| 2004/0075470 | A1 * | 4/2004 | Oodaira et al. | .............. 326/121 |
| 2007/0022246 | A1 * | 1/2007 | Regev et al. | ................ 711/108 |

* cited by examiner

*Primary Examiner*—Vibol Tan
*Assistant Examiner*—Dylan White
(74) *Attorney, Agent, or Firm*—Martine Penilla & Gencarella, LLP

(57) ABSTRACT

An approach is provided in embodiments of the present invention for building multiple-output static CMOS logic gate circuits that share transistors when computing multiple functions from a common set of inputs. In particular, an approach is provided which includes building multiple-output static NAND gates that compute the subfunctions of three or more inputs and building multiple-output static NOR gates that compute the subfunctions of two or more inputs. The approach also includes building multiple-output static XOR-XNOR gates that are capable of computing two-input XOR, three-input XOR, two-input XNOR, and three-input XNOR, and building multiple-output static Propagate-Generate (PG) compound gates. The approach further includes building carry propagate adders, priority encoders, binary-to-thermometers, decoders, etc. that are capable of using the multiple-output static gates embodied in the present invention.

16 Claims, 10 Drawing Sheets

MULTIPLE-OUTPUT STATIC LOGIC

BACKGROUND

1. Field of the Invention

The invention relates generally to integrated circuits and, more particularly, to multiple-output Static CMOS logic gate circuits that are capable of simultaneously computing more than one logic function.

2. Description of the Related Art

In integrated circuits, one common objective is to generate digital output(s) from digital input(s) where the digital output(s) are predetermined functions of the digital input(s). Traditionally, integrated circuits satisfy this objective via a logic circuit that uses electronic devices called gates, which utilize Boolean algebra to perform "combinational" tasks. For example, a logic circuit can be designed that multiplies two numbers A and B (inputs) to produce and output C. In this case, Boolean AND logic would be implemented to multiply the two numbers A and B to produce the output C.

Complementary Metal-Oxide Semiconductor (CMOS) transistors are commonly used to build gates on integrated circuits. CMOS transistors can be viewed as three-terminal electrically controlled switches. The gate terminal is the control input. The source and the drain terminals are either connected or disconnected depending on the voltage at the gate terminal. A transistor is ON when the source and the drain are connected and OFF otherwise. The transistors are one of two types: nMOS (negative polarity) transistors and pMOS (positive polarity) transistors. Specifically, nMOS transistors turn ON when a logic '1' is applied to the gate terminal and pMOS transistors turn ON when a logic '0' is applied to the gate terminal.

CMOS logic gates can be structurally implemented using approaches that include domino logic and static CMOS logic. These CMOS logic gates are built from networks of transistors connected in parallel or series. They receive one or more inputs and produce a single output. In a conventional static CMOS logic gate, a pull-down network of nMOS transistors is connected between the output and the ground, and a pull-up network of pMOS transistors is connected between the output and the power. The inputs control the gates of the transistors so that either the NMOS network or the pMOS network is ON at any given time, which drives the output to either a logic '0' value or a logic '1' value. In contrast, the pMOS pull-up network in a domino logic gate is removed and replaced with a precharge transistor.

In the case where multiple logic functions (i.e. multiple outputs) are required for digital circuit to perform a particular task, multiple logic gates (each producing only one output) must be linked together to produce multiple outputs. The result of using multiple logic gates is that the area and the power consumption of the circuit are increased in proportion to the number of transistors used—i.e. the greater the number of logic gates, the greater the number of transistors. To overcome this need for multiple logic gates, multiple-output domino logic gate designs have been developed which share transistors in the pull-down network to simultaneously compute several related logic functions (i.e. a single domino logic gate produces multiple outputs). However, domino circuits have become increasingly difficult to use because of problems of leakage, coupling, process variation, supply noise, clock skew, and productivity etc.

In view of the foregoing, there is a need for a systematic design of multiple-output Static CMOS logic gates that share transistors when computing multiple functions from a common set of inputs.

SUMMARY

In one embodiment, the present invention provides a multiple-output static logic gate that is capable of computing a NAND of three or more inputs and subfunctions thereof.

In another embodiment, the present invention provides a multiple-output static logic gate that is capable of computing a NOR of two or more inputs and subfunctions thereof.

In another embodiment, the present invention provides a multiple-output static logic gate that is capable of computing one of XOR of three or more inputs and subfunctions thereof, XNOR of three or more inputs and subfunctions thereof, or XOR of three or more inputs and subfunctions thereof and XNOR of three or more inputs and subfunctions thereof.

In another embodiment, the present invention provides a multiple-output static logic gate that is capable of computing a compound function of three or more inputs and computing one or more other functions, wherein the one or more other functions share one or more inputs with compound function.

In yet another embodiment, the present invention provides a decoder that comprises a NAND tree multiple-output static logic gate.

Other aspects and advantages of the invention will become apparent from the following detailed description, taken in conjunction with the embodiments and accompanying drawings, illustrating, by way of example, the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

Figure 1A:
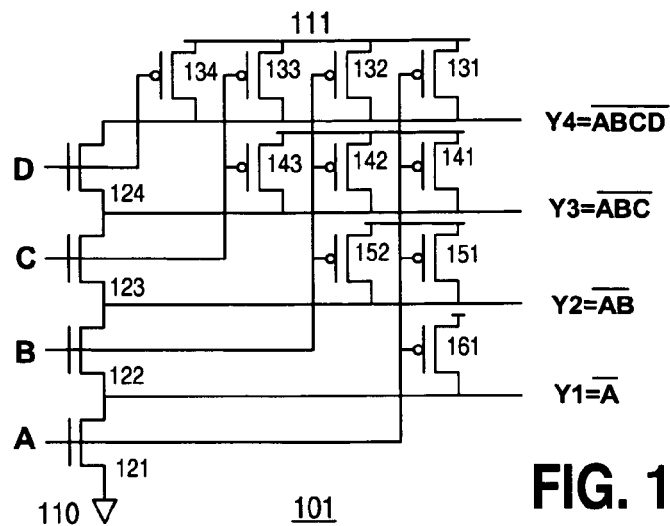
FIG. 1A is a circuit schematic illustrating a four-input multiple-output static NAND logic gate, in accordance with an embodiment of the present invention.

An approach is provided in embodiments of the present invention for producing multiple-output static CMOS logic gate circuits that are capable of simultaneously computing more than one logic function and which share transistors connected to one or more common inputs. The multiple-output static CMOS logic gates of embodiments of the present invention consume less area and power than conventional multiple single-output gate circuit design approaches because they have fewer transistors. Furthermore, the multiple-output static logic gates of embodiments of the present invention can obviate the problems that are typically encountered with the use of domino circuits. Additionally, the multiple-output static logic gates of embodiments of the present invention can potentially produce increased processing speeds because they present less capacitance on critical inputs.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention. The present invention includes several aspects and is presented below and discussed in connection with the Figures and embodiments.

To begin, an introduction to some traditional concepts of Boolean (switching) algebra is provided below to illustrate the most basic relationship between logic gates and the logic functions they perform. As recognized by those of ordinary skill in the relevant art, Boolean algebra is a fundamental mathematical tool for designing and analyzing logic circuits whose digital output(s) are generated from digital input(s) and where the digital output(s) are predetermined functions of the digital input(s). The three basic types of logic functions include the AND, the OR, and the NOT function and, by utilizing these three basic logic functions, any Boolean equation can be implemented by a logic gate. However, other logic functions, namely NAND ("NOT-AND"), NOR ("NOT-OR"), XOR ("exclusive-OR"), and XNOR ("exclusive-NOR") etc., which are functions derived from the three basic logic functions are also commonly utilized.

The Boolean symbol for OR is "+", and the expression "A OR B" is commonly written A+B. Likewise, the Boolean symbol for AND can be denoted by a dot "•" or simple juxtaposition, and the expression "A AND B" is commonly written as A B, or, alternatively, in the juxtapositional notation AB. Juxtapositional notation will be used throughout this document to discuss embodiments of the present invention. The Boolean symbol for NOT (the compliment of a logic level) is a bar over the symbol, and the expression is commonly written as $\overline{A}$. The compliment logic function NOT can be combined with gates to form the NAND and NOR logic functions. As such, the expression "A NAND B" is commonly written as A·B or $\overline{AB}$, and the expression "A NOR B" is commonly written as $\overline{A+B}$. The XOR logic function is identical to modulo-two addition of two bits and, as such, the output of an XOR gate is HIGH if one or the other (but not both) input is HIGH. Correspondingly, the output of an XNOR gate is HIGH if both of its inputs are equal. The expression "A XOR B" is commonly written as A⊕B and likewise, the expression "A XNOR B" is commonly written as $\overline{A \oplus B}$.

In FIG. 1, according to an embodiment of the present invention, a family of representative merged three-or-more input, multiple-output NAND static logic gates is shown. Specifically, in one embodiment, FIG. 1A illustrates a four-output static CMOS logic gate 101 that computes the NAND of four inputs, A, B, C, and D, and all three subfunctions thereof to produce four outputs Y4, Y3, Y2, and Y1: Y4= $\overline{ABCD}$, Y3=$\overline{ABC}$, Y2=$\overline{AB}$, and Y1=$\overline{A}$. Y4 is the NAND of inputs A, B, C, and D. Y3, Y2, and Y1 are subfunctions of Y4.

The multiple output static CMOS logic gate 101 embodied in FIG. 1A includes four series nMOS transistors, 121-124, that form a pull-down network of transistors between outputs Y4, Y3, Y2, and Y1 and Ground 110. The logic gate 101 also includes four parallel pMOS transistors 131-134 connected between output Y4 and $V_{DD}$ 111. Collectively, transistors 121-124 and transistors 131-134 compute Y4=$\overline{ABCD}$, a NAND of four inputs, A, B, C, and D.

The multiple output static logic gate 101 also includes three parallel pMOS transistors 141-143 connected between output Y3 and $V_{DD}$ 111. Collectively, transistors 121-123 and transistors 141-143 compute Y3=$\overline{ABC}$, a NAND of three inputs, A, B, and C. Similarly, gate 101 includes two parallel pMOS transistors 151-152 connected between output Y2 and $V_{DD}$ 111. Collectively, transistors 121-122 and transistors 151-152 compute Y2=$\overline{AB}$, a NAND of two inputs, A and B. Finally, gate 101 includes one pMOS transistor 161 connected between output Y1 and $V_{DD}$ 111. Collectively, transistors 121 and 161 compute Y1=$\overline{A}$, a NAND of one inputs, A (where a NAND of a single input is defined to be equivalent to a NOT gate).

Based on the discussion above, it will become apparent to those of ordinary skill that the multiple-output static CMOS logic NAND gate 101 embodied in FIG. 1A is capable of computing multiple outputs from a single logic gate which, in turn, facilitates using fewer transistors to compute the multiple outputs in comparison to conventional approaches which require multiple single-output static CMOS logic gates to produce the same multiple outputs. In particular, the multiple-output static CMOS logic NAND gate 101 of FIG. 1A uses only fourteen transistors to compute functions Y4, Y3, Y2, and Y1, whereas computing the same four functions using four separate conventional static CMOS logic gates would require twenty transistors. Thus, the multiple-output NAND static CMOS logic gate 101 of FIG. 1A conserves the space and the power resources that would otherwise have been used to support six additional transistors.

Figure 1B:
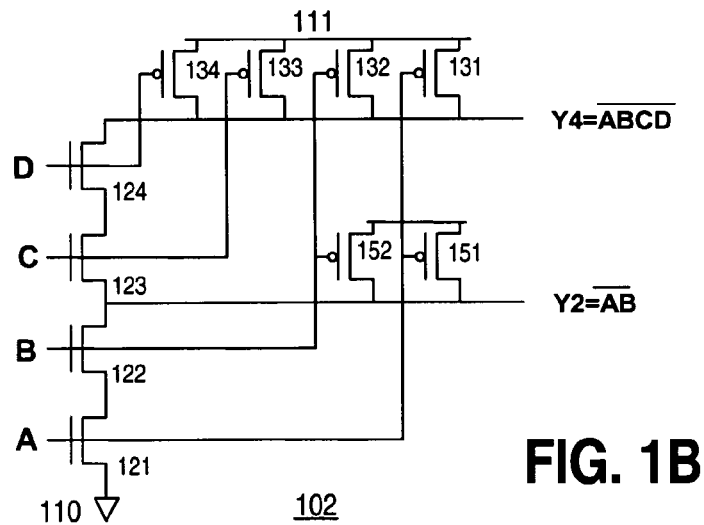
FIG. 1B is a circuit schematic illustrating a four-input multiple-output static NAND logic gate with a subset of the sub-functions illustrated in FIG. 1A, in accordance with an embodiment of the present invention.
Figure 1C:
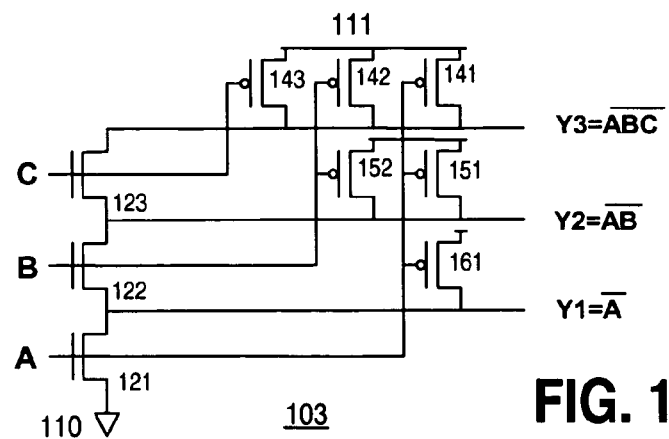
FIG. 1C is a circuit schematic illustrating a three-input multiple-output static NAND logic gate, in accordance with an embodiment of the present invention.

In FIG. 1B, in another embodiment of the present invention, a variation on the multiple-output NAND static CMOS logic gate 101 of FIG. 1A is illustrated to show that any combination of subfunctions can be computed depending on the particular requirements of the logic circuit. Specifically, FIG. 1B shows a two-output static CMOS logic gate 102 computing the NAND of four inputs A, B, C, and D and only one subfunction thereof: $Y4=\overline{ABCD}$ and $Y2=\overline{AB}$. Y4 is the NAND of inputs A, B, C, and D, and Y2 is a subfunction of Y4. Gate 102 is similar to gate 101, but omits outputs Y3 and Y1 and the pMOS transistors 141-143 and 161 associated with these outputs. In fact, according to embodiments of the present invention, any combination of functions can be computed from inputs A, B, C, and D by the multiple-output NAND logic gates of FIG. 1 including, but not limited to, the following: $\overline{ABCD}$, $\overline{ABC}$, and $\overline{AB}$; $\overline{ABCD}$, $\overline{ABC}$, and $\overline{A}$; $\overline{ABCD}$, $\overline{AB}$, and $\overline{A}$; $\overline{ABCD}$ and $\overline{ABC}$; $\overline{ABCD}$ and A; etc.

Moreover, the multiple-output static NAND logic gates of embodiments of the present invention, can compute any combination of subfunctions from any number of inputs. For example, in FIG. 1C, a three-output NAND static logic gate 103 is shown computing the NAND of only three inputs A, B, and C, and the sub-functions thereof: $Y3=\overline{ABC}$, $Y2=\overline{AB}$, and $Y1=\overline{A}$. Gate 103 is similar to gate 101, but omits input D, output Y4, and transistors 104 and 131-134 that are used to compute the four-input NAND function. According to embodiments of the present invention, any combination of functions can be computed from inputs A, B, and C by the multiple-output NAND logic gate 103 of FIG. 1C including the following: $\overline{ABC}$ and $\overline{AB}$, and $\overline{ABC}$ and $\overline{A}$.

Although not illustrated, the family of merged multiple-output static NAND gates embodied in FIG. 1 can also readily generalize to computing the NAND of five or more inputs and any subfunctions thereof. For example, the NAND of inputs A, B, C, D, and E, $\overline{ABCDE}$, and any combination of subfunctions thereof can be computed.

In view of the discussion above, it should be apparent that the family of merged three-or-more input NAND gates of embodiments of the present invention is not limited only to those representative structures illustrated in FIG. 1. Rather, the multiple-output NAND static logic gates of embodiments of the present invention can have varied structural configurations according the requirements of the particular integrated circuit application. Additionally, as discussed in more detail below in FIG. 6, in an alternative embodiment of the present invention, the merged multiple-output static NAND logic gates of embodiments of the present invention discussed above regarding FIG. 1 can be included in electronic devices such as priority encoders, etc.

Figure 2A:
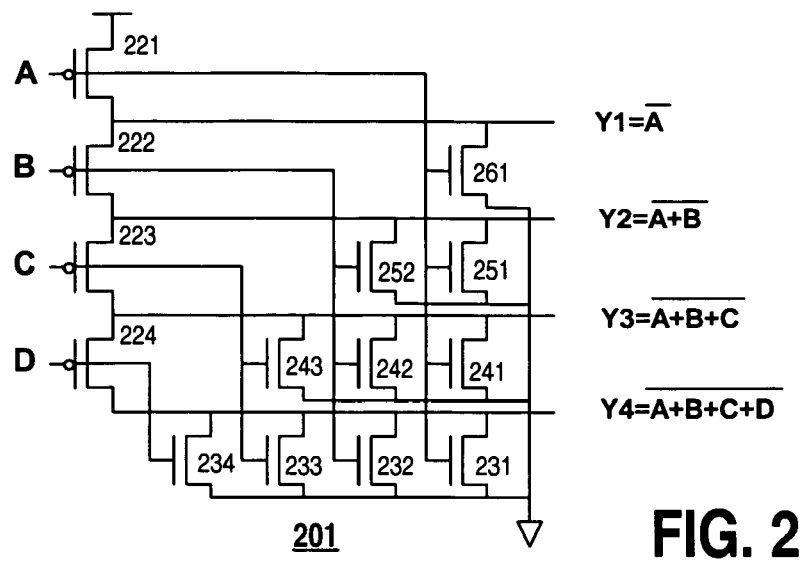
FIG. 2A is a circuit schematic illustrating a four-input multiple-output static NOR logic gate, in accordance with an embodiment of the present invention.

In FIG. 2, according to another embodiment of the present invention, a family of representative merged two-or-more input, multiple-output NOR static logic gates is illustrated. Generally, as recognized by those of skill in the relevant art, NOR logic gates are similar to NAND logic gates except that NOR logic gates include nMOS transistors in parallel and pMOS transistors in series. Specifically, in FIG. 2A in one embodiment of the present invention, a four-output static CMOS logic gate 201 is illustrated computing the NOR of four inputs A, B, C, and D, and all three sub-functions thereof: $Y4=\overline{A+B+C+D}$, $Y3=\overline{A+B+C}$, $Y2=\overline{A+B}$, and $Y1=\overline{A}$. Y4 is the NOR of inputs A, B, C, and D, and Y3, Y2, and Y1 are the subfunctions of Y4.

In gate 201, pMOS transistors 221-224 and NMOS transistors 231-234 form an ordinary 4-input static NOR computing $Y4=\overline{A+B+C+D}$. Transistors 221-223 and 241-243 form a 3-input static NOR computing $Y3=\overline{A+B+C}$. Transistors 221-222 and 251-252 form a 2-input static NOR computing $Y2=\overline{A+B}$. And transistors 221 and 261 form a 1-input static NOR computing $Y1=\overline{A}$, where a 1-input NOR is defined to be equivalent to a NOT gate. As is the case with the NAND gates of FIG. 1, the static CMOS NOR logic gate 201 of FIG. 2A is capable of computing multiple outputs from a single logic gate, thereby using fewer transistors to conserve area and power.

Figure 2B:
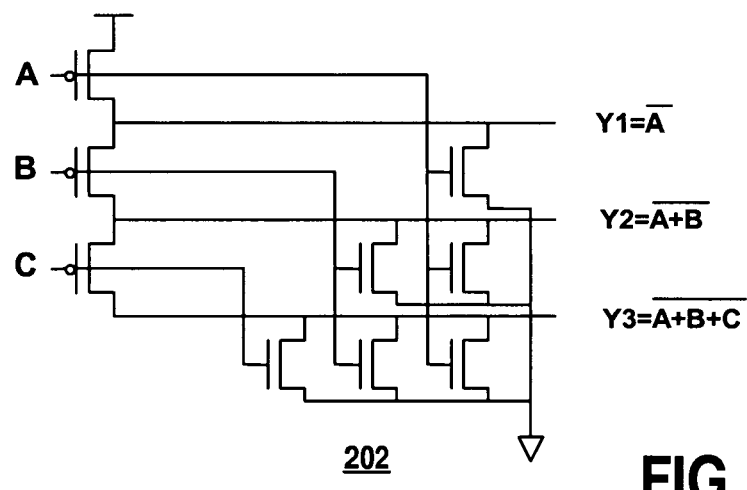
FIG. 2B is a circuit schematic illustrating a three-input multiple-output static NOR logic gate, in accordance with an embodiment of the present invention.

In FIG. 2B, in one embodiment of the present invention, a variation on the static CMOS NOR logic gate 201 of FIG. 2A is shown. Specifically, in FIG. 2B, a three-output static CMOS logic gate 202 is shown that is capable of computing the NOR of three inputs A, B, and C and subfunctions thereof: $Y3=\overline{A+B+C}$, $Y2=\overline{A+B}$, and $Y1=\overline{A}$. Y3 is the NOR of inputs A, B, and C, and Y2 and Y1 are subfunctions thereof. Gate 202 is similar to gate 201, but omits transistors 224 and 231-234 because the four-input NOR function is not computed.

Figure 2C:
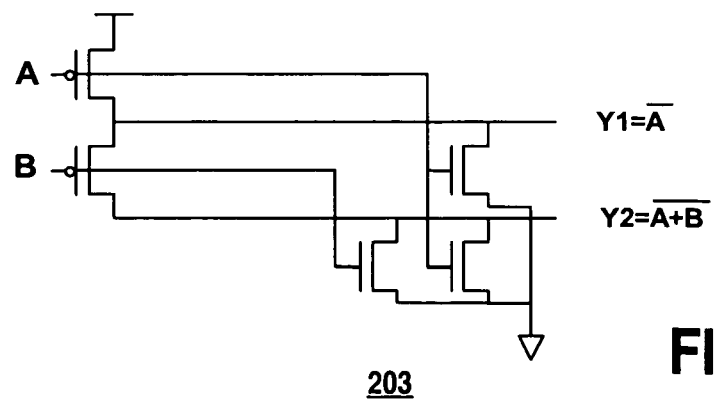
FIG. 2C is a circuit schematic illustrating a two-input multiple-output static NOR logic gate, in accordance with an embodiment of the present invention.

In FIG. 2C, in an embodiment of the present invention, a two-output static CMOS logic gate 203 is illustrated that is capable of computing the NOR of two inputs and one subfunction thereof: $Y2=\overline{A+B}$ and $Y1=\overline{A}$. Gate 203 is similar to gate 202, but omits transistors 223 and 241-243 because the three-input NOR function is not computed.

Similar to merged multiple-output NAND logic gates of embodiments of the present invention discussed above regarding FIG. 1, the merged two-or-more input, multiple-output NOR static logic gates of embodiments of the present invention are not limited to only those logic gates illustrated in FIG. 2. Specifically, using the multiple-output NOR static logic gates of the FIG. 2 etc. embodiments of the present invention, it is possible to compute any portion of the sub-functions of multiple numbers of inputs or to generalize to five or more inputs etc. For example, the NOR of inputs A, B, and C, and subfunctions thereof, can include: $\overline{A+B+C}$ and $\overline{A+B}$; $\overline{A+B+C}$ and A; etc. Likewise, the NOR of inputs A, B, C, and D, and subfunctions thereof, can include: $\overline{A+B+C+D}$, $\overline{A+B+C}$, and $\overline{A+B}$; $\overline{A+B+C+D}$, $\overline{A+B+C}$, and $\overline{A}$; $\overline{A+B+C+D}$, $\overline{A+B}$, and $\overline{A}$; $\overline{A+B+C+D}$ and $\overline{A+B+C}$; $\overline{A+B+C+D}$ and $\overline{A+B}$; $\overline{A+B+C+D}$ and A; etc. Additionally, as discussed in more detail below regarding FIG. 6, in an alternative embodiment of the present invention, the merged multiple-output static NOR logic gates of embodiments of the present invention can be included (used) in electronic devices such as priority encoders.

Figure 3:
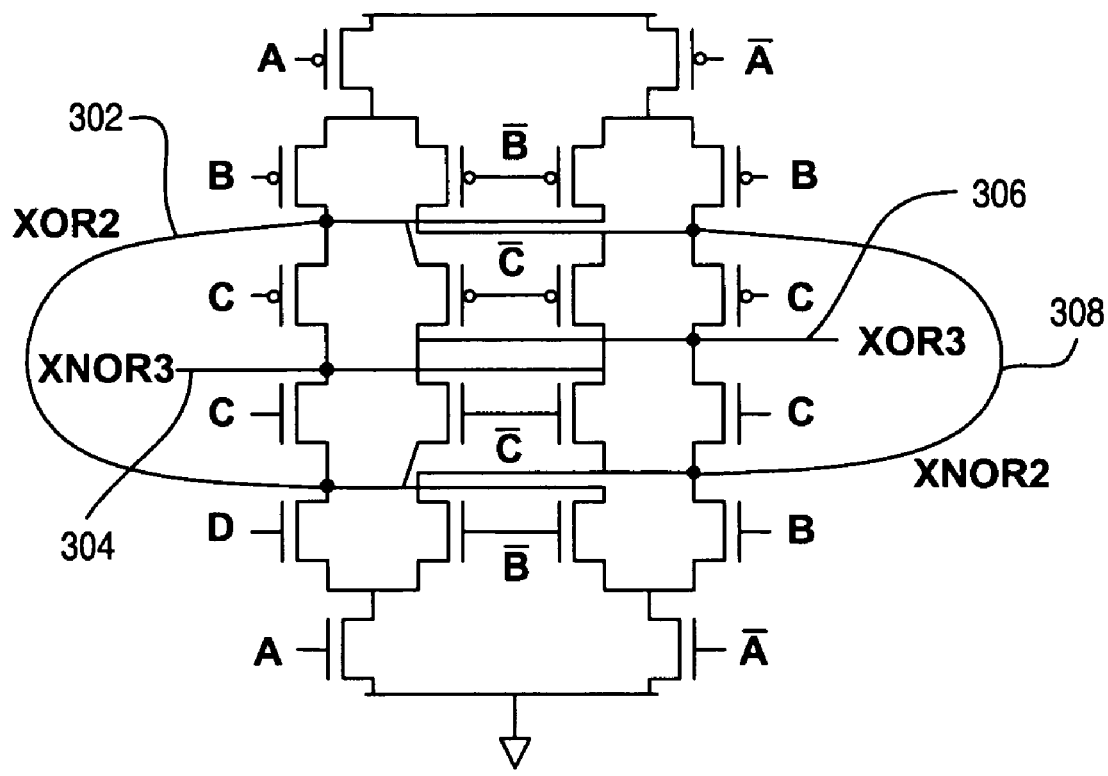
FIG. 3 is a circuit schematic illustrating a multiple-output static XOR-XNOR logic gate, with a two-input XOR-XNOR coupled with a three-input XOR-XNOR, in accordance with an embodiment of the present invention.

In FIG. 3, in yet another embodiment of the present invention, a representative multiple-output static logic gate computing the XOR and/or XNOR of three or more inputs is illustrated. Specifically, FIG. 3 shows a merged multiple-output static CMOS logic gate 301 capable of computing a two-input XOR (i.e. XOR2) 302, a three-input XOR (i.e. XOR3) 306, a two-input XNOR (i.e. XNOR2) 308, and a three-input XNOR (i.e. XNOR3) 304. In particular, the XOR of inputs A, B, and, C is A⊕B⊕C; the XNOR of inputs A, B, and C is $\overline{A⊕B⊕C}$; the XOR of inputs A and B is A⊕B; and the XNOR of inputs A and B is $\overline{A⊕B}$. In gate 301, XOR2 and XNOR2 are subfunctions of XOR3 and XNOR3.

It is important to note that the principles which extend to the representative multiple-output XOR/XNOR static CMOS logic gate 301 of FIG. 3, also extend to alternative embodiments of the present invention that can include any multiple-output XOR/XNOR gate with three or more inputs, multiple-output XOR/XNOR gates of four or more inputs, and multiple-output XOR/XNOR gates in which any combination of subfunctions are computed, etc. As was demonstrated for the NAND and NOR gates, the partial set of subfunctions is obtained by deleting the unnecessary outputs and their associated transistors that are not shared with other functions. For example, according to other embodiments of the present invention, the multiple-output XOR/XNOR gates of embodiments of the present invention are capable of computing the following functions and sub functions for inputs A, B, and C: $A \oplus B \oplus C$, $A \oplus B$, and $\overline{A \oplus B}$; $A \oplus B \oplus C$ and $A \oplus B$; $A \oplus B \oplus C$ and $\overline{A \oplus B}$; $\overline{A \oplus B \oplus C}$, $\overline{A \oplus B}$, and $A \oplus B$; $\overline{A \oplus B \oplus C}$ and $A \oplus B$; $\overline{A \oplus B \oplus C}$ and $\overline{A \oplus B}$, etc. Moreover, it is important to note that in one embodiment of the present invention, a two-input XOR can be defined to be a subfunction of a 3-input XNOR as well as a subfunction of a 3-input XOR. Similarly, a two-input XNOR can be a subfunction of a 3-input XOR as well as a subfunction of a 2-input XOR. In FIG. 4, in another embodiment of the present invention, multiple-output compound CMOS logic gates that perform AND-OR-INVERT (AOI) and OR-AND-INVERT (OAI) functions such as $\overline{A+BC}$, $\overline{(A+B)C}$, $\overline{AB+CD}$, $\overline{A(B+CD)+EF+G}$, etc. on three or more inputs, are illustrated. As recognized by those of ordinary skill in the art, conventional AOI gates and OAI gates are called "compound gates" because they perform both the OR and the AND logic functions in a single step. However, unlike conventional AOI and OAI compound gates, the AOI and OAI compound gates of embodiments of the present invention are multiple-output gates. In particular, the compound CMOS logic gates of embodiments of the present invention are capable of sharing transistors with other compound gates, or with NAND gates or NOR gates, or with inverters, to form multiple-output static logic gates.

Figure 4A:
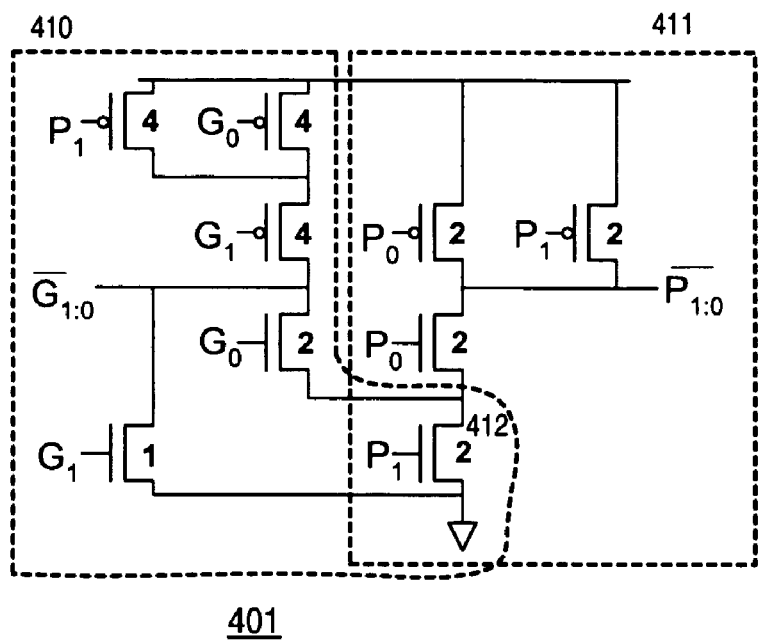
FIG. 4A is a circuit schematic illustrating a multiple-output compound valency-two PG static logic gate, in accordance with an embodiment of the present invention.

In FIG. 4A, in one embodiment of the present invention, a compound Valency-two Propagate-Generate (PG) static AOI-NAND logic gate 401 that computes two outputs $\overline{G}_{1:0} = \overline{G_1 + G_0 P_1}$ and $\overline{P}_{1:0} = \overline{P_0 P_1}$, is illustrated. Specifically, the static AOI-NAND logic gate 401 includes a compound AOI gate 410 that computes output $\overline{G}_{1:0} = \overline{G_1 + G_0 P_1}$ from inputs $G_0$, $G_1$, and $P_1$. And the static AOI-NAND logic gate 401 further includes a NAND gate 411 that shares an nMOS transistor 407, which is connected to input $P_1$, with the compound AOI gate 410, the NAND gate 411 computing output $\overline{P}_{1:0} = \overline{P_0 P_1}$ from inputs $P_0$ and $P_1$. By sharing the nMOS transistor 412, the compound AOI gate 410 and the NAND gate 411 combine to form a single multiple-output static CMOS logic gate rather than two independent gates.

Because the NAND gate 411 can perform a propagate signal and the compound AOI gate 410 can perform a generate signal, to simultaneously compute the two functions $\overline{G}_{1:0} = \overline{G_1 + G_0 P_1}$ and $\overline{P}_{1:0} = \overline{P_0 P_1}$, the compound multiple-output PG logic gates of embodiments of the present invention are particularly suited for adder applications etc. For example, the multiple-output PG logic gate 401 of FIG. 4A (and other multiple-output PG logic circuits of embodiments of the present invention) is useful for "prefix adder" applications that form group generate (G) and propagate (P) signals. In prefix adders, a group of bits will generate a carry if the upper part of the group of bits generates one or if the lower part of the group of bits generates the carry and the upper part propagates the carry, and a group of bits will propagate a carry if both the lower and upper parts propagate the carry. Thus, by using shared transistors (e.g. transistor 412 of FIG. 4A), the area and the power that would otherwise be consumed by a transistor if the transistor were duplicated in two separate gates, are saved. In one embodiment of the present invention, the propagate (P) and generate (G) signals are mutually exclusive so that only one of two outputs can be discharged through the shared transistor. This can require that the propagate signal be defined as the XOR, rather than the OR, of the two inputs to the adder.

Based on the discussion above regarding FIG. 4A, it will be apparent to one of ordinary skill in the art that significant performance benefits can be achieved using the multiple-output PG logic gates of embodiments of the present invention. For example, the performance benefits of a PG gate can be quantified by its logical effort (the ratio of its input capacitance to that of an inverter that delivers the same output current). Referring again to FIG. 4A, the transistor widths in the merged static AOI-NAND gate 401 are labeled to give the same current as a unit inverter with an nMOS transistor of width 1 and a pMOS transistor of width 2. Thus, the logical effort on the critical PI input is (2+2±4)/3=8/3. In comparison, the AOI gate 410 of FIG. 4A has a logical effort of 6/3 and the NAND gate 411 has a logical effort of 4/3. Therefore, the PG circuit 401 built from the two separate gates (411 and 410) has a logical effort of 10/3. Thus, we can expect that the multiple-output AOI-NAND is 20% faster than two separate gates.

Figure 4B:
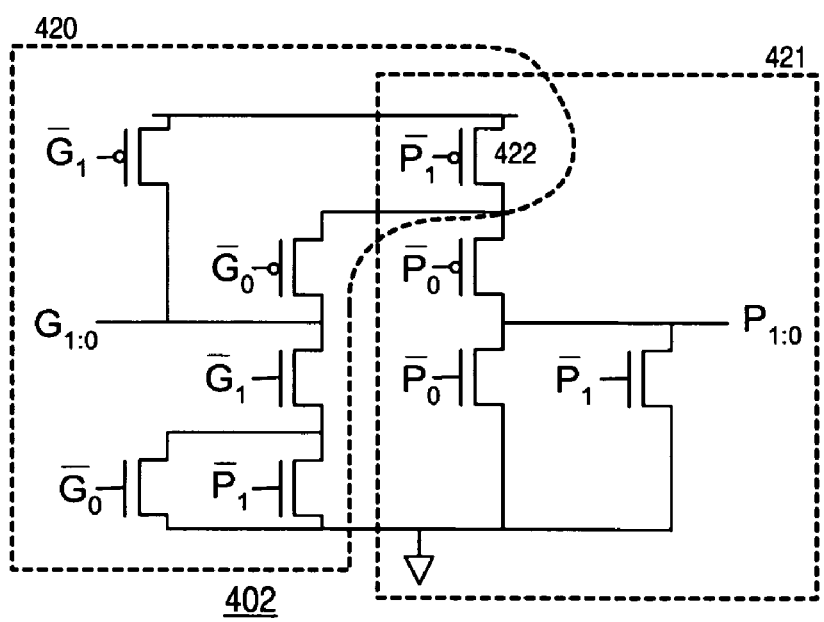
FIG. 4B is a circuit schematic illustrating a multiple-output compound valency-two PG static logic gate (with complementary inputs), in accordance with an embodiment of the present invention.

In FIG. 4B, in one embodiment of the present invention, a dual of the compound multiple-output Valency-two Propagate-Generate (PG) static AOI-NAND logic gate 401 of FIG. 4A is illustrated. Specifically, FIG. 4B illustrates a compound multiple-output OAI-NOR Valency-two PG logic gate 402 that includes a compound OAI gate 420 that computes output $G_{1:0} = \overline{G_1(G_0 + P_1)}$ from inputs $G_0$, $G_1$, and $P_1$. The Valency-two PG gate 402 also includes a NOR gate 421 that computes output $P_{1:0} = \overline{P_0 + P_1}$ from inputs $P_0$ and $P_1$. The compound OAI gate 420 and the NOR gate 421 share a pMOS transistor 422 that is connected to input $P_1$, thereby forming the single compound multiple-output Valency-two PG logic gate 402. Advantageously, the Valency-two PG logic gate circuit 402 has a logical effort of 7/3 on the critical $\overline{P}_1$ input, as compared to a logical effort of 11/3 for conventional separate OAI and NOR gates.

Figure 4C:
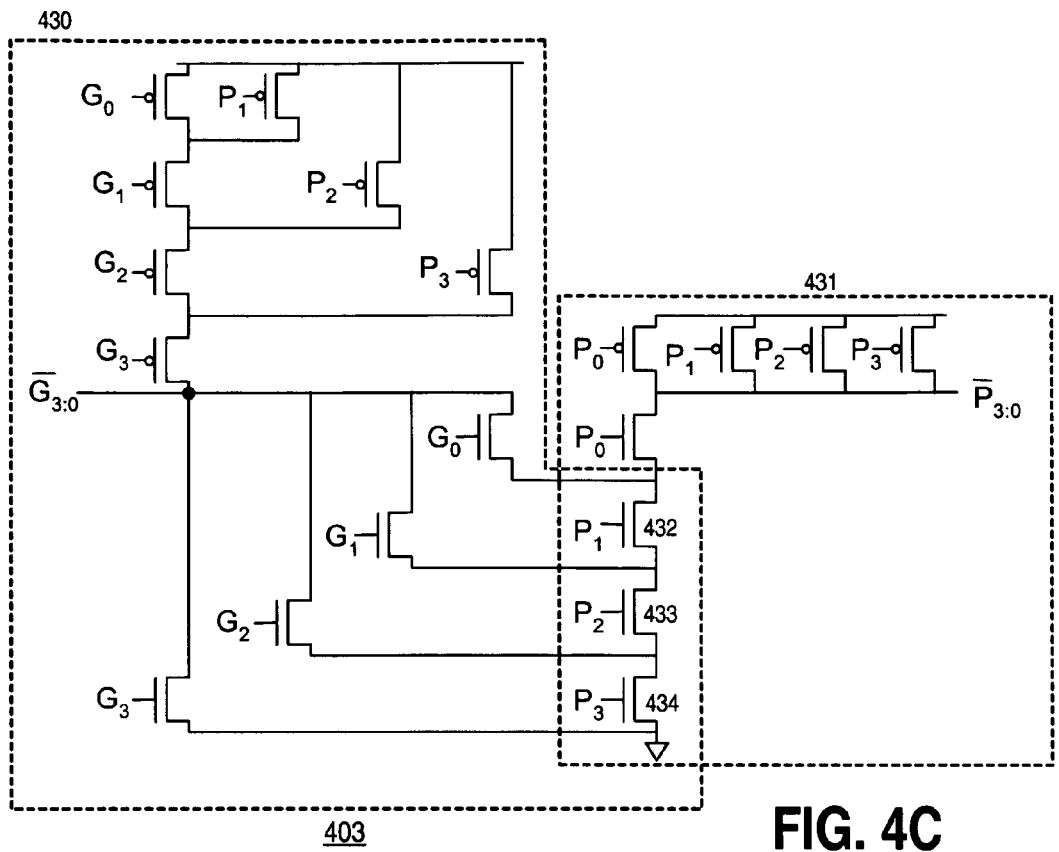
FIG. 4C is a circuit schematic illustrating a multiple-output compound valency-four PG static logic gate, in accordance with an embodiment of the present invention.

In FIG. 4C, in one embodiment of the present invention, a variation of the multiple-output PG gates principles illustrated in FIGS. 4A and 4B is extended to multiple-output PG circuits that generalize to additional inputs. For example, FIG. 4C illustrates a Valency-four PG, two-output static logic gate 404 that computes two outputs $\overline{G}_{3:0} = \overline{G_3 + P_3(G_2 + P_2(G_1 + P_1 G_0))}$ and $\overline{P}_{3:0} = \overline{P_0 P_1 P_2 P_3}$. The static logic gate 404 includes a merged AOI gate 430 that computes output $\overline{G}_{3:0} = \overline{G_3 + P_3(G_2 + P_2(G_1 + P_1 G_0))}$ and includes a NAND gate 431 that computes output $\overline{P}_{3:0} = \overline{P_0 P_1 P_2 P_3}$ The merged AOI gate 430 and the NAND gate 431 share three nMOS transistors (432, 433, and 434), which are connected to inputs $P_1$, $P_2$, and $P_3$, respectively.

Figure 4D:
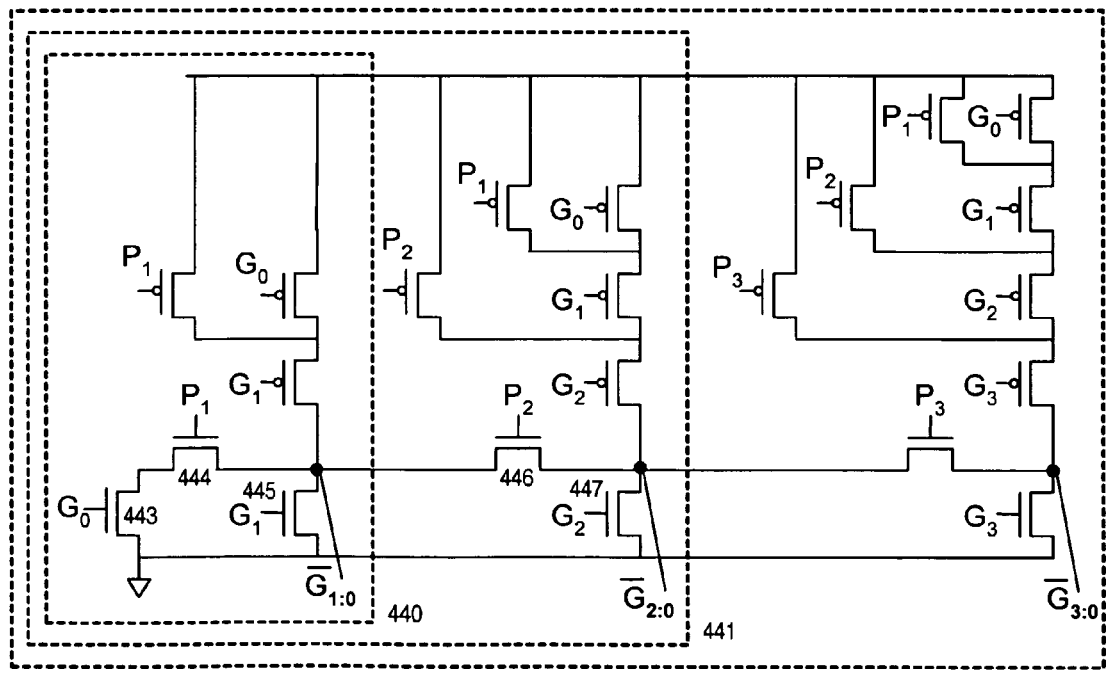
FIG. 4D is a circuit schematic illustrating a multiple-output compound valency-four generate circuit static logic gate, in accordance with an embodiment of the present invention.

In FIG. 4D, in alternate embodiment of the present invention, a multiple-output PG logic circuit can be implemented to compute all of the prefixes of the generate signal (G) or of the propagate signal (P). For example, in one embodiment, FIG. 4D illustrates a multiple-output Valency-four Generate Circuit 404 that can compute all three prefixes (outputs): $\overline{G}_{3:0} = \overline{G_3 + P_3(G_2 + P_2(G_1 + P_1 G_0))}$, $\overline{G}_{2:0} = \overline{G_2 + P_2(G_1 + P_1 G_0)}$, and $\overline{G}_{1:0} = \overline{G_1 + G_0 P_1}$. The Valency-four Generate Circuit 404 includes a compound gate 440 that computes $\overline{G}_{1:0} = \overline{G_1 + G_0 P_1}$ from inputs $G_0$, $G_1$, and $P_1$. The Valency-four Generate Circuit 404 also includes a compound gate 441 that computes $\overline{G}_{2:0} = \overline{G_2 + P_2(G_1 + P_1 G_0)}$ from inputs $G_0$, $G_1$, $G_2$, $P_1$, and $P_2$, and a compound gate 442 that computes $\overline{G}_{3:0} = \overline{G_3 + P_3(G_2 + P_2(G_1 + P_1 G_0))}$. The multiple-output compound gate 404 shares nMOS transistors 443, 444, 444, 445, 446, and 447 among two or more outputs. This multiple-output compound gate 404 is similar in concept to a static Manchester carry chain, though eliminating kill and NOT (propagate) signals from the Manchester carry chain comes at the expense of the bulky pMOS pull-up networks. Generally, the embodiment discussed in connection with FIG. 4D extends the principles discussed above in connection with FIGS. 4A and 4B to multiple-output logic gates that can simultaneously compute generate signals (G) for a two-bit group, a three-bit group, and a four-bit group. These generate signals can be used in a carry propagate adder.

Moreover, alternate embodiments of the multiple-output static logic gates discussed above regarding the FIG. 4 family of compound logic gates can be provided. For example, one embodiment of the present invention, multiple-output gates similar to the Valency-four PG, two-output static logic gate 403 illustrated in FIG. 4C can be implemented to perform PG computations for other radices, such as three or five etc. In another embodiment, duals of the logic gates similar to the Valency-four PG, two-output static logic gate 403 illustrated in FIG. 4C can also be implemented to use merged OR-AND-INVERT and NOR structures to produce true outputs from complementary inputs.

In yet another embodiment, as discussed in more detail below regarding FIG. 5, at least two outputs of a compound multiple-output static logic gate like that illustrated in the FIG. 4C embodiments of the present invention can be computed for a carry propagate adder, one output computing a valency-four group generate signal and the other output computing a valency-four group propagate signal. And at least two outputs of a compound multiple-output static logic gate like those illustrated in the FIGS. 4A and 4B embodiments of the present invention can be computed for a carry propagate adder, one output computing a valency-two generate signal and the other output computing a valency-two propagate signal. For example, a Kogge-Stone adder, etc. In still a further alternative embodiment, the compound gate of the multiple-output static logic gates of FIG. 4 etc. can compute a group generate signal and the NAND or NOR gate of the multiple-output static logic gates of FIG. 4 can compute a group propagate signal for a valency-three or higher propagate-generate (PG) gate.

As is well-known in the art, generate and propagate gates can be used in carry propagate adders. See, for example, N. Weste and D. Harris, *CMOS VLSI Design: A Circuits and Systems Perspective*, Boston: Addison Wesley, 2005. In another embodiment of the present invention, multiple-output compound gates computing generate and/or propagate signals are used in carry propagate adders to reduce the number of transistors required compared to conventional designs with separate single-output gates. Multiple-output gates can be used to save transistors in any carry propagate adder architecture that uses P and G signals, such as carry lookahead, carry select, carry skip, carry increment, and prefix adders such as Kogge-Stone, Ladner-Fischer, Sklansky, Knowles, Brent-Kung, or Han-Carlson. The multiple-output gates can compute valency-2, valency-3, valency-4 or higher-valency propagate and/or generate signals.

Figure 5A:
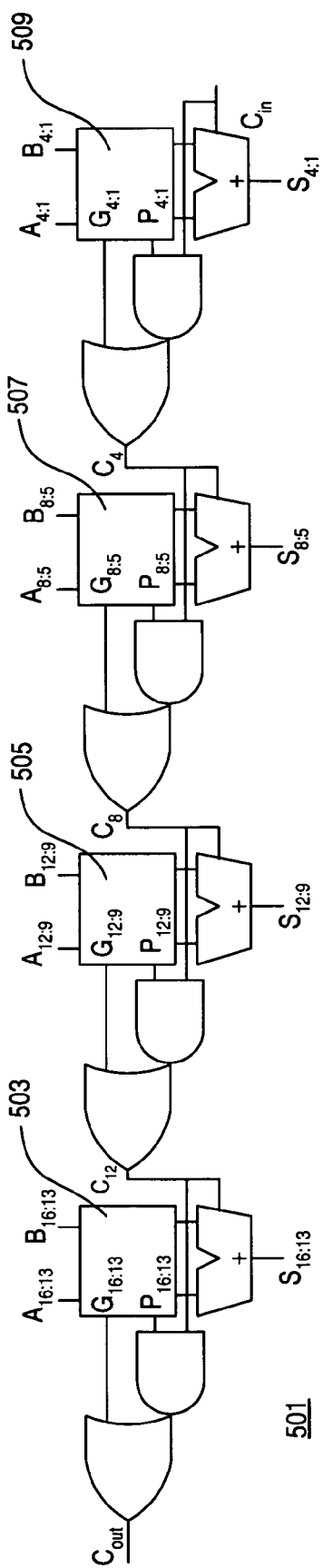
FIG. 5A is a circuit schematic illustrating a carry propagate adder including multiple-output static logic gates, in accordance with an embodiment of the present invention.

For example, in FIG. 5A, in one embodiment of the present invention, a "Carry Lookahead" Adder 501 is illustrated. The adder contains four-bit lookahead blocks 503, 505, 507, and 509, that produce four-bit generate and propagate signals. In one embodiment of this invention, these signals are produced using the multiple-output Valency-four PG logic gate 403 shown in FIG. 4C.

Figure 5B:
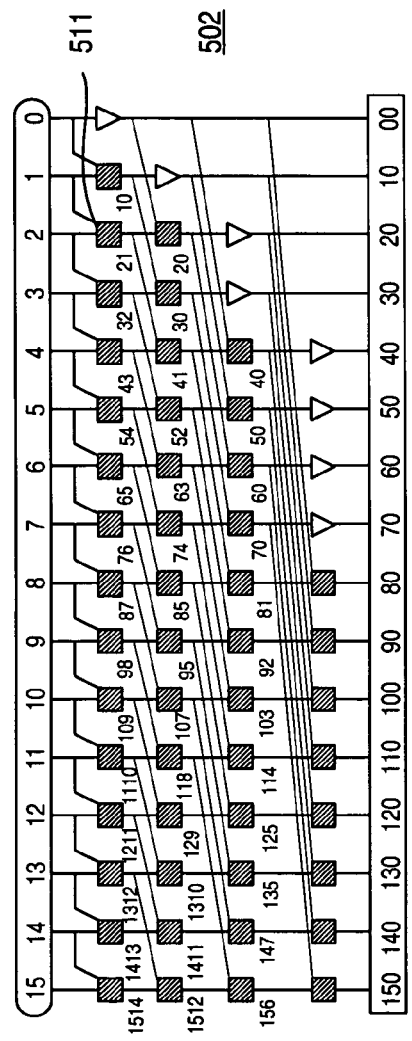
FIG. 5B is a circuit schematic illustrating a Kogge-Stone carry propagate adder including multiple-output static logic gates, in accordance with an embodiment of the present invention.

In FIG. 5B, in one embodiment of the present invention, a valency-2 Kogge-Stone Adder 502 is illustrated. As is well-known in the art, the black cells (such as 511) compute valency-2 propagate and generate signals. In one embodiment of the present invention, these black cells use multiple-output Valency-two PG logic gates such as 401 and 402, shown in FIGS. 4A and 4B, respectively. It is important to note, however, that embodiments of the present invention are applicable to many other adder applications that are not specifically discussed herein. An additional application for the use of the multiple-output static logic approach of embodiments of the present invention is "priority encoding." Priority encoders are often used in Content Addressable Memory (CAM) and bus arbitration applications, etc. Conventionally, a priority encoder has N inputs, $A_{N:1}$, and N outputs, $Y_{N:1}$. The priority encoder asserts an output associated with a highest priority input. The outputs are defined using the Priority Encoder logic equations:

$$Y_1 = A_1$$

$$Y_2 = A_2(\overline{A}_1)$$

$$Y_3 = A_3(\overline{A}_2\overline{A}_1)$$

$$Y_4 = A_4(\overline{A}_3\overline{A}_2\overline{A}_1)$$

$$Y_5 = A_5(\overline{A}_4\overline{A}_3\overline{A}_2\overline{A}_1)$$

And because the outputs of the priority encoder share common terms, the outputs are a natural application for the multiple-output static logic gates of embodiments of the present invention.

Figure 6:
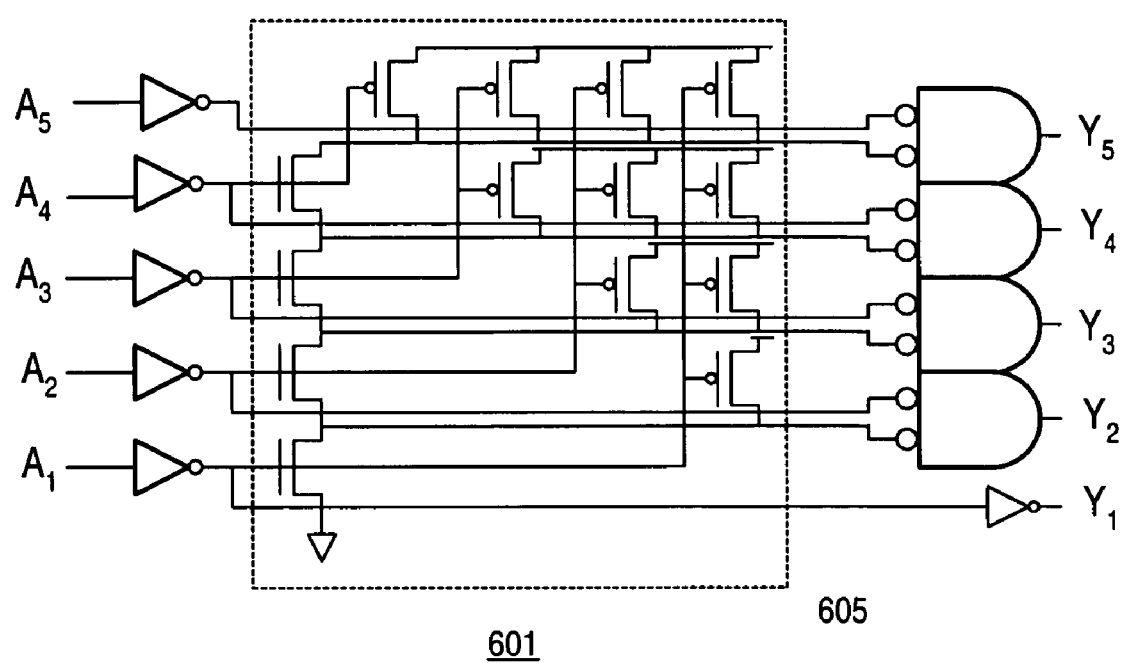
FIG. 6 is a circuit schematic illustrating a priority encoder including a multiple-output static logic NAND gate, in accordance with an embodiment of the present invention.

For example, in FIG. 6, a Priority Encoder 601 of one embodiment of the present invention is illustrated. The Priority Encoder 601 includes a multiple-output NAND gate 605 similar to the gate 101 illustrated in FIG. 1A. This gate 605 computes the terms in parentheses in the Priority Encoder logic equations. The Priority Encoder 601 also includes various other logic gates to complement the inputs and to merge the results of gate 605 with other signals to form the priority encoder outputs.

Another application for the use of the multiple-output static logic approach of embodiments of the present invention is a "binary-to-thermometer" encoder. Binary-to-thermometer encoders are typically used in data conversion applications, and many other applications etc. Generally, binary-to-thermometer encoders include N inputs $A_{N-1:0}$ and $M=2^N-1$ outputs, $Y_{M:1}$. If the input is a binary representation of k, the k least-significant output bits will be asserted. The outputs of a 3:7 encoder, for example, are defined as:

$$Y_1 = A_2 + A_1 + A_0$$

$$Y_2 = A_2 + A_1$$

$$Y_3 = A_2 + A_1 A_0$$

$$Y_4 = A_2$$

$$Y_5 = A_2(A_1 + A_0)$$

$$Y_6 = A_2 A_1$$

$$Y_7 = A_2 A_1 A_0$$

And, again, because the binary-to-thermometer encoder shares common terms, it is a natural application for the multiple-output static logic gates of embodiments of the present invention.

Figure 7:
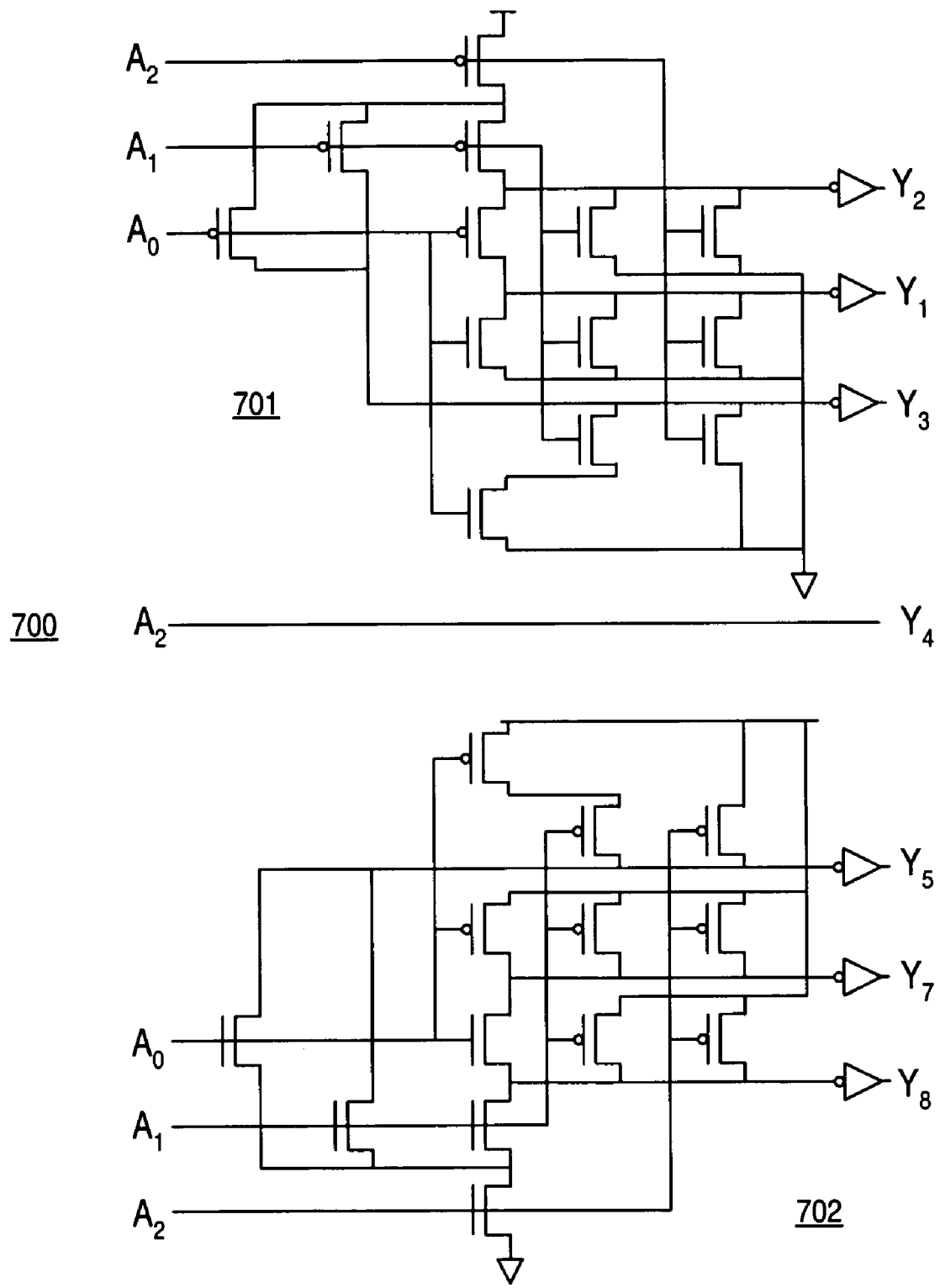
FIG. 7 is a circuit schematic illustrating a binary-to-thermometer encoder including multiple-output static logic gates, in accordance with an embodiment of the present invention.

For example, in FIG. 7, a Binary-to-thermometer Encoder 700 is illustrated that includes a three-bit input ($A_0, A_1, A_2$), a seven-bit output ($Y_1, Y_2, Y_3, Y_4, Y_5, Y_6, Y_7$), where input $A_2$ is propagated thru to compute output $Y_4$. The three bits of input, $A_0$, $A_1$, and $A_2$, represent a number from zero to seven—this is called "binary encoding." In "thermometer encoding," there are traditionally seven outputs and either none of the outputs are TRUE, or only the first output is TRUE, or only the first and second outputs are TRUE, or only the first, second and third outputs are TRUE, and so on—e.g. similar to mercury rising in a thermometer. The Binary-to-thermometer Encoder 700 includes a compound multiple-output static logic gate 701 and a dual compound multiple-output static logic gate 702 that together compute all seven outputs ($Y_1, Y_2, Y_3, Y_4, Y_5, Y_6, Y_7$). The gates 701 and 702 each produce three outputs. They share transistors, reducing the number of transistors required as compared to an implementation of the logic equations using conventional static gates.

Figure 8:
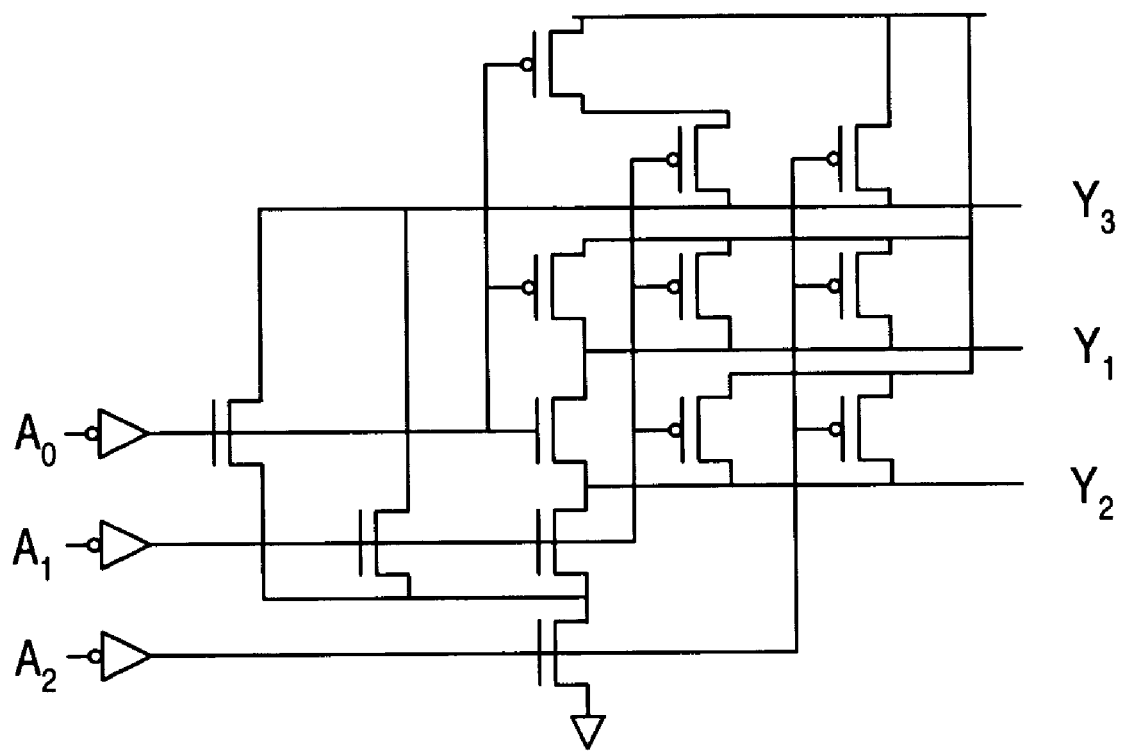
FIG. 8 is a circuit schematic illustrating an approach for reusing an identical multiple-output static logic gate to perform thermometer encoding on least-significant bits as well as on most-significant bits.

As will be apparent to one of ordinary skill in the art, many variations of "binary-to-thermometer" encoders that use the multiple-output static logic gates of embodiments of the present invention to perform binary-to-thermometer encoding are possible. Thus, the "binary-to-thermometer" Encoder 700 of FIG. 7 represents only one such embodiments, and is not meant to limit other alternative embodiments of the present invention. For example, in alternate embodiments of the present invention, the output Inverters can be omitted, leaving an inverting encoder. Additionally, in other embodiments of the present invention, by using inverted inputs, series pMOS networks can be replaced with series nMOS networks. FIG. 8 shows such a design for outputs $Y_3$ to $Y_1$ ($Y_{3:1}$) using a multiple-output gate identical to the gate 702 used for outputs $Y_5$ to $Y_7$ ($Y_{5:7}$) in FIG. 7, but with inverted inputs rather than outputs. Moreover, in further embodiments of the present invention, encoders that are larger or smaller than those previously discussed can also share common terms and, therefore, can use one or more of the multiple-output static logic gates of embodiments of the present invention.

Figure 9:
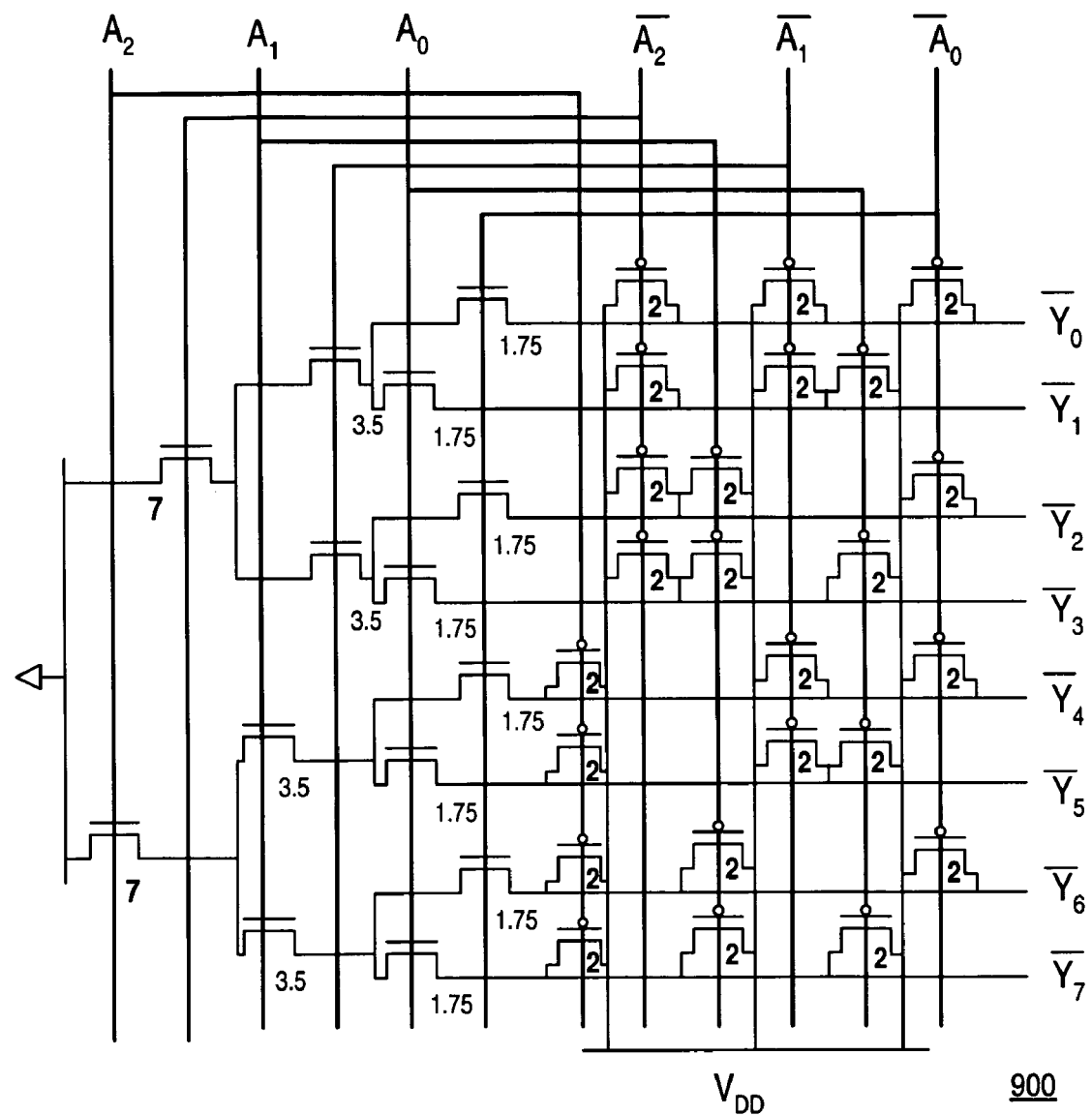
FIG. 9 is a circuit schematic illustrating a NAND tree multiple-output static logic gate-based decoder.

In FIG. 9, one embodiment of the present invention, an application using multiple-output static logic decoders is illustrated. Conventionally, a decoder has N inputs $A_{N-1:0}$ and $M=2^N$ outputs, $Y_{N-1:0}$. Exactly one of the output bits is asserted. FIG. 9 shows a 3:8 Decoder 900 using NAND tree-based multiple-output static logic. The circuit is called a NAND tree because the nMOS transistors are in series in a tree structure. Parallel pMOS transistors pull up each of the eight outputs. Each transistor is annotated with its width relative to a unit inverter. The circuit has a logical effort of 1.25 per output, as compared to 1.5 per output for Lyon's design, indicating that it is faster. The outputs are complemented, so they may be followed by an inverter. As compared to a conventional design with separate NAND gates for each output, this multiple-output gate uses fewer nMOS transistors.

In view of the discussion above, it should be apparent that embodiments of the present invention provide a novel approach to multiple-output static logic gates. This invention has described several embodiments of multiple-output static logic gates that share one or more transistors. Those of ordinary skill in the art will realize that many other multiple output static logic gates can also be devised from the same principles. Those of ordinary skill in the art will also realize that the names given to the inputs are of no significance.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A multiple-output static logic gate computing a NAND of a plurality of inputs and subfunctions thereof, the logic gate comprising:
   a plurality of NMOS transistors connected serially between ground and a first output, the gate of each of the plurality of NMOS transistors connected to one of the plurality of inputs;
   a corresponding plurality of PMOS transistors, the gate of each PMOS transistor from the corresponding plurality being connected to one of the inputs, each PMOS transistor from the corresponding plurality connecting a positive voltage to the first output, each input being connected to a transistor from the corresponding plurality; and
   a subfunction plurality of PMOS transistors, the gate of each PMOS transistor from the subfunction plurality being connected to one of the inputs, each PMOS transistor from the subfunction plurality having terminals connected between a positive voltage and a subfunction output;
   wherein the first output is a NAND computation of all the inputs;
   wherein the subfunction output is a NAND computation of a subset of the inputs.

2. The multiple-output static logic gate as recited in claim 1, wherein there are three inputs A, B, and C and the subfunctions thereof include $\overline{AB}$, and $\overline{A}$.

3. The multiple-output static logic gate as recited in claim 1, wherein there are three inputs A, B, and C and the subfunctions thereof include $\overline{AB}$.

4. The multiple-output static logic gate as recited in claim 1, wherein there are three inputs A, B, and C and the subfunctions thereof include $\overline{A}$.

5. The multiple-output static logic gate as recited in claim 1, wherein there are four inputs A, B, C, and D and the subfunctions thereof include $\overline{ABC}$, $\overline{AB}$, and $\overline{A}$.

6. The multiple-output static logic gate as recited in claim 1, wherein there are four inputs A, B, C, and D and the subfunctions thereof include $\overline{ABC}$, and $\overline{AB}$.

7. The multiple-output static logic gate as recited in claim 1, wherein there are four inputs A, B, C, and D and the subfunctions thereof include $\overline{ABC}$, and $\overline{A}$.

8. The multiple-output static logic gate as recited in claim 1, wherein there are four inputs A, B, C, and D and the subfunctions thereof include $\overline{AB}$, and $\overline{A}$.

9. The multiple-output static logic gate as recited in claim 1, wherein there are four inputs A, B, C, and D and the subfunctions thereof include $\overline{ABC}$.

10. The multiple-output static logic gate as recited in claim 1, wherein there are four inputs A, B, C, and D and the subfunctions thereof include $\overline{AB}$.

11. The multiple-output static logic gate as recited in claim 1, wherein there are four inputs A, B, C, and D and the subfunctions thereof include $\overline{A}$.

12. The multiple-output static logic gate as recited in claim 1, wherein there are five inputs.

13. The multiple-output static logic gate as recited in claim 1, wherein the multiple-output static logic gate is included in a priority encoder.

14. A multiple-output static logic gate, comprising:
   a plurality of NMOS transistors connected serially between ground and a first output, the gate of each of the plurality of NMOS transistors connected to one of a plurality of inputs;

a corresponding plurality of PMOS transistors, the gate of each PMOS transistor from the corresponding plurality being connected to one of the inputs, each PMOS transistor from the corresponding plurality connecting a positive voltage to the first output, each input being connected to a transistor from the corresponding plurality; and a subfunction plurality of PMOS transistors, the gate of each PMOS transistor from the subfunction plurality being connected to one of the inputs, each PMOS transistor from the subfunction plurality having terminals connected between a positive voltage and a subfunction output;

wherein the first output is a NAND computation of all the inputs;

wherein the subfunction output is a NAND computation of a subset of the inputs.

15. The multiple-output static logic gate as recited in claim 14, wherein there are four inputs A, B, C and D, wherein the subfunction plurality of PMOS transistors includes three transistors connected to inputs A, B, and C, wherein the subfunction output is $\overline{ABC}$.

16. The multiple-output static logic gate as recited in claim 15, the logic gate further including, a first PMOS transistor connecting power to a second subfunction output, the gate of the first PMOS transistor being connected to A, a second PMOS transistor connecting power to the second subfunction output, the gate of the second PMOS transistor being connected to B, wherein the second subfunction output is $\overline{AB}$.

* * * * *